United States Patent [19]

Karl et al.

[11] Patent Number: 4,890,185
[45] Date of Patent: Dec. 26, 1989

[54] CIRCUIT FOR PROTECTING A SWITCHING TRANSISTOR

[75] Inventors: Heinz-Dietmar Karl; Manfred Tinebor, both of Barntrup; Josef Lackhove, Aerzen, all of Fed. Rep. of Germany

[73] Assignee: Lenze GmbH & Co. KG Aerzen, Arezen, Fed. Rep. of Germany

[21] Appl. No.: 283,741

[22] Filed: Dec. 13, 1988

[30] Foreign Application Priority Data

Dec. 23, 1987 [DE] Fed. Rep. of Germany ....... 3743866

[51] Int. Cl.⁴ .............................................. H02H 3/20
[52] U.S. Cl. ..................................... 361/91; 323/276; 330/207 P
[58] Field of Search ..................... 361/89, 101, 93, 98, 361/91, 86; 323/265, 266, 274, 277, 276; 350/207 P, 298

[56] References Cited

U.S. PATENT DOCUMENTS 4,589,049  5/1986  Krumrein .................. 361/91 X
4,672,527  6/1987  Lagadec et al. ............ 323/266 X Primary Examiner—Derek S. Jennings
Attorney, Agent, or Firm—Charles E. Baxley

[57] ABSTRACT

A circuit for protecting a switching transistor connected between a direct-current voltage source and an inductive load has a voltage-limiting element connected between the source and the transistor for switching the transistor when the voltage of the source exceeds a predetermined limit, elements for deriving from the voltage-limiting element a control signal when the source voltage exceeds the predetermined limit, and a variable pulse-width modulator connected to a control input of the transistor and receiving the signal from the means. The modulator decreases pulse width when the source voltage exceeds the limit.

7 Claims, 2 Drawing Sheets

CIRCUIT FOR PROTECTING A SWITCHING TRANSISTOR

FIELD OF THE INVENTION

The present invention relates to circuit for protecting a switching transistor. More particularly this invention concerns the protection against overvoltages of a switching transistor connected between a direct-current voltage source and an inductive load, for instance a motor.

BACKGROUND OF THE INVENTION

A switching transistor typically operated by a pulse-width modulator is connected between a direct-current voltage source and an inductive load such as a motor. A voltage-limiting element such as a zener diode is normally also connected to the source and to the switching transistor to operate same when the voltage exceeds a predetermined limit.

In such a switching transistor the breakdown voltage is normally such that it is not exceeded under normal conditions by the applied source voltage plus the switching voltage and the line and stray inductances. It is impractical to use a transistor whose breakdown voltage is so high that it exceeds the highest overvoltage that may be encountered. For this reason it is standard to use a protective circuit by means of which the switching transistor is protected against overvoltages that exceed its breakdown voltage.

Thus it is known to connect a voltage-limiting element such as a varistor or zener diode across the switching transistor. The avalanche or zener voltage of such a device is selected below the breakdown voltage of the switching transistor so that when a potentially dangerous overvoltage occurs, this transistor is shunted out. It is therefore necessary that such a voltage-limiting element be large enough that it can pass relatively massive amounts of energy and can dissipate the heat generated by its own losses.

Another solution uses such a voltage-limiting device to actually switch the switching transistor. This makes it possible to use a relatively small zener, avalanche diode, or varistor since it merely serves to feed a blocking voltage to a control input of the switching transistor which itself is then open-circuited. The switching transistor can normally dissipate larger losses than the voltage-limiting elements.

This latter solution has the disadvantage that the switching transistor has only limited capacity to dissipate losses. Thus overvoltages which last quite some time, as is the case with line-voltage sources, can eventually overheat and ruin the switching transistor.

In order to avoid such long-term loading and burnout of the switching transistor it has further been suggested to provide circuitry that monitors the source voltage and that feeds to the pulse-width modulator a blocking signal when an overvoltage is detected. This causes the switching transistor, under the control of the modulator, to open circuit and stay open as long as the overvoltage exists. This reduces the voltage on the switching transistor to the switched voltage. Such an arrangement does protect the switching transistor, but has the considerable disadvantage that it results in complete shutdown of the system, that is deenergization of the load. In other words the motor being controlled will stop when the supply voltage exceeds the threshold level, something that normally cannot be tolerated.

OBJECTS OF THE INVENTION

It is therefore an object of the present invention to provide an improved circuit for protecting such a switching transistor.

Another object is the provision of such an improved circuit for protecting such a switching transistor which overcomes the above-given disadvantages, that is which actively protects the switching transistor without completely shutting down the load being run by the switching transistor.

SUMMARY OF THE INVENTION

A circuit for protecting a switching transistor connected between a direct-current voltage source and an inductive load according to this invention has a voltage-limiting element connected between the source and the transistor for switching the transistor when the voltage of the source exceeds a predetermined limit, elements for deriving from the voltage-limiting element a control signal when the source voltage exceeds the predetermined limit, and a variable pulse-width modulator connected to a control input of the transistor and receiving the signal from the means. The modulator decreases pulse width when the source voltage exceeds the limit.

The instant invention is based on the idea that with a long-term overvoltage in the supply voltage the switching transistor is kept operational, but the switching voltage is reduced. Since the level of the switching voltage with a constant switch time is dependent of the level of the current through the line and inductive load, the switching voltage is reduced by reducing the current. This is done via the pulse-width modulator which is controlled in an overvoltage condition by the control signal such that the pulse width of the pulse train that controls the switching transistor is shortened.

According to another feature of this invention the control signal is formed by voltage peaks exceeding the avalanche voltage of the voltage-limiting element. The transistor is switched when the control signal exceeds a predetermined voltage level.

In accordance with a further feature of this invention the voltage-limiting element is a zener diode having a cathode connected to an input element of the switching transistor and an anode connected to a condenser. A discharge resistor is connected between the condenser-anode junction and an input of the pulse modulator. A current regulator is connected at a summing point the condenser and to the input of the modulator and a desired-value signal generator is connected to the summing point so that the control signal and desired-value signal are there summed.

According to the invention a second zener diode is connected between the anode of the first-mentioned zener diode and the input of the switching transistor. In addition the avalanche voltage of the second zener diode is such that the condenser can charge sufficiently to set the ratio of the modulator equal to 0.

DESCRIPTION OF THE DRAWING

The above and other objects, features, and advantages will become more readily apparent from the following, reference being made to the accompany drawing in which.

SPECIFIC DESCRIPTION

Figure 1:
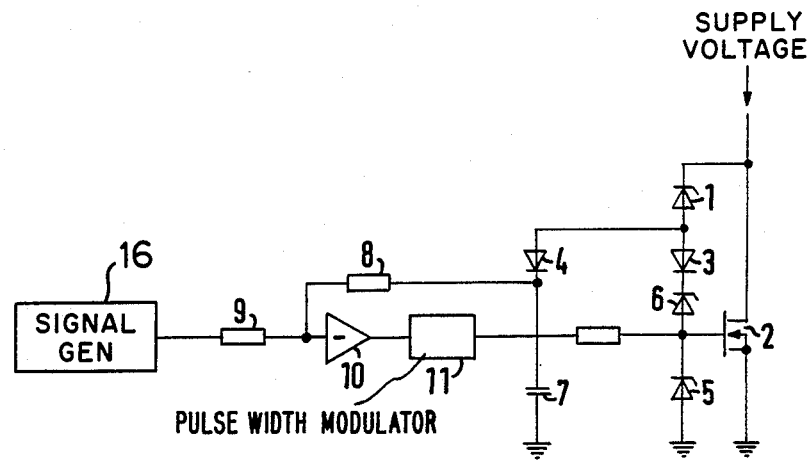
FIG. 1 is a circuit diagram of a simplified embodiment of the instant invention.

As seen in FIG. 1 a switching transistor 2 according to this invention has an input connected to the cathode of a voltage-limiting zener diode 1 whose anode is connected via a diode 4 and condenser 7 to ground. A discharge resistor 8 is connected between the condenser 7 and diode 4 and to a summing point at the input of a current regulator 10. This summing point is connected via a resistor 9 with a set-point signal generator 16 whose set-point signal is summed with the voltage from the resistor 8 to produce a difference voltage which is fed to the current regulator 10. The output of the regulator 10 is fed to the control input of a pulse-width modulator 11 whose output is connected to the control input of the switching transistor 2. In addition the diode 1 has its anode connected via a diode 3 and a second zener diode 6 directly to the control input of the transistor 2 which is also connected to ground via another zener diode 5.

In the event of an overvoltage the zener 1 becomes conducting like a voltage-limiting diode and the current flowing through it and the diode 4 charges the capacitor 7. The charging current passes through the discharge resistor 8 to reduce the pulse-pause ratio of the pulse-width modulator 11. As a result the next cycle of the current through the switching transistor 2 and, hence, the switched voltage are reduced. If the discharge time constant of the capacitor 7 is very large with respect to the period of the current being controlled, the working point will be very stable relative to the level of the static feed overvoltage.

If there is a short high-power overvoltage pulse the condenser 7 is more rapidly charged than the current can be reduced in the load by changing the pulse-pause ratios. In this case the switching transistor 2 is controlled via the diode 3 and the zener 6. The overvoltage is actually limited by the switching transistor which when excited is conducting. The breakdown voltage of the zener 6 is such that the condenser 7 can be charged until the pulse-pause ratio of the modulator 11 is zero, when the switching transistor 2 is switched to dynamic overvoltage limiting. The length of the discharge constant of the condenser 7 gives the transistor 2 a recovery time in order to make up for the losses from overvoltage limiting.

Figure 2:
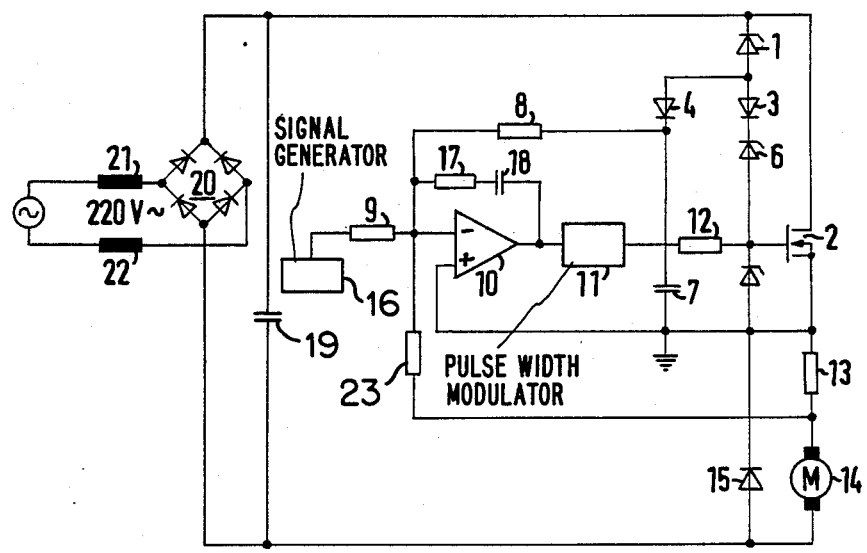
FIG. 2 is a circuit diagram of another embodiment of the system of the present invention.

FIG. 2 shows an analog 20 KHz circuit for controlling the current of a motor 14. The basic system corresponds to that of FIG. 1, with identical reference numerals referring to functionally identical structure. The motor 14 is fed from line via a full-wave rectifier bridge 20 and two infeed resistors 21 and 22. The feed current is gauged by means of the current resistor 13 in series with the motor 14 and transformed via a further resistor 23 into an actual value fed to the regulator 10. When the line voltage exceeds the desired value from the generator 16 a control signal is formed by means of the limiting diode 1, the diode 4, and the condenser 7, which control signal is in turn fed via the discharge resistor 8 to the summing point at the input of the current regulator 10. As a result the regulator 10 reduces the motor current enough that the maximum voltage of the transistor 2 is not exceeded.

Figure 3:
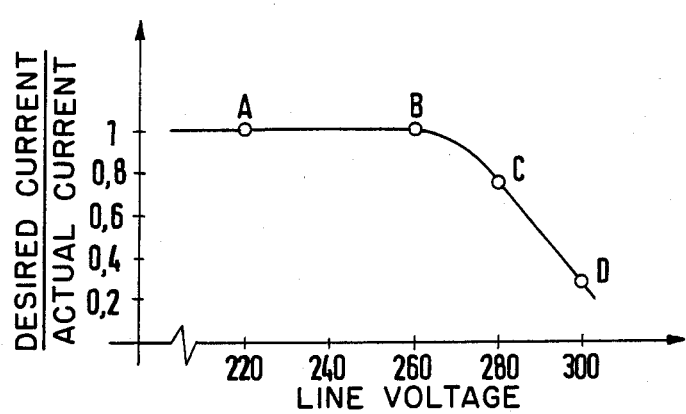
FIGS. 3 and 4 are graphs illustrating operation of the system of this invention.
Figure 4:
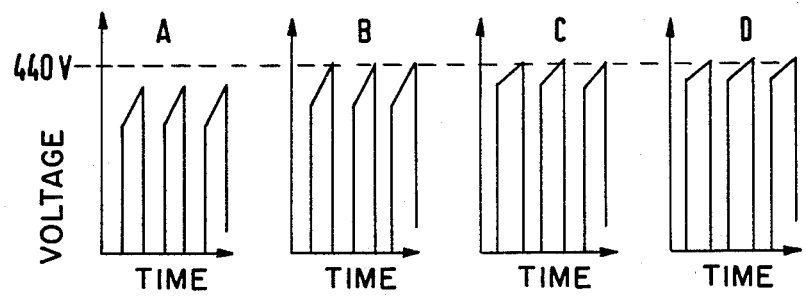

The relationship between motor current and the level of static supply voltage is shown in FIG. 3, as produced by the circuit of FIG. 2. A diode with a breakdown voltage of 440 V is used so that the motor can be fed with maximum current from a line of 260 V. Further increase in the line voltage will reduce the motor current by means of the above-described circuit. The line voltage is shown in FIG. 4 at the times indicated at A, B, C, and D in FIG. 3. This shows that when the line voltage exceeds 260V the motor current is controlled such that the voltage across the switching transistor corresponds to the breakdown voltage of 440 V.

Thus the reduction of the motor current with increasing line voltage reduces the portion of switching voltage. The maximum voltage on the switching transistor 2 is held at a constant level.

The principal advantage with the system of this invention is that when the motor current is controlled during a line overvoltage only the motor current and the motor torque is reduced. An overload of the transistor 2 on the one hand as well as a stopping of the drive on the other is avoided with this system.

We claim:

1. A circuit for protecting a switching transistor connected between a direct-current voltage source and an inductive load, the circuit comprising:
    a voltage-limiting element connected between the source and the transistor for switching the transistor when the voltage of the source exceeds a predetermined limit;
    means for deriving from the voltage-limiting element a control signal when the source voltage exceeds the predetermined limit; and
    a variable pulse-width modulator connected to a control input of the transistor and receiving the signal from the means, the modulator decreasing pulse width when the source voltage exceeds the limit.

2. The circuit defined in claim 1 wherein the control signal is formed by voltages exceeding the avalanche voltage of the voltage-limiting element.

3. The circuit defined in claim 1 wherein the switching transistor is switched when the control signal exceeds a predetermined voltage level.

4. The circuit defined in claim 1 wherein the voltage-limiting element is a zener diode having a cathode connected to an input element of the switching transistor and an anode, the means including a condenser connected to the anode and a discharge resistor connected between the condenser-anode junction and an input of the pulse modulator.

5. The circuit defined in claim 4, further comprising:
    a current regulator connected at a summing point the condenser and to the input of the modulator; and
    a desired-value signal generator connected to the summing point.

6. The circuit defined in claim 4, further comprising a second zener diode connected between the anode of the first-mentioned zener diode and the input of the switching transistor.

7. The circuit defined in claim 6 wherein the avalanche voltage of the second zener diode is such that the condenser can charge sufficiently to set the ratio of the modulator equal to 0.

* * * * *